United States Patent [19]

Kitamura

[11] 4,375,067
[45] Feb. 22, 1983

[54] SEMICONDUCTOR LASER DEVICE HAVING A STABILIZED OUTPUT BEAM

[75] Inventor: Takashi Kitamura, Yokohama, Japan

[73] Assignee: Canon Kabushiki Kaisha, Tokyo, Japan

[21] Appl. No.: 147,174

[22] Filed: May 6, 1980

[30] Foreign Application Priority Data

| May 8, 1979 | [JP] | Japan | 54-56794 |
| Jan. 23, 1980 | [JP] | Japan | 55-6685 |
| Jan. 23, 1980 | [JP] | Japan | 55-6686 |

[51] Int. Cl.³ .................. G01D 15/14; H01S 3/10
[52] U.S. Cl. .................. 346/160; 250/205; 346/108; 372/43
[58] Field of Search ........... 357/19; 250/551, 205; 355/14, 68; 358/285, 302; 346/160, 76 L, 108; 331/94.5 H, 94.5 S, 94.5 P; 369/116

[56] References Cited

U.S. PATENT DOCUMENTS

| 4,125,777 | 11/1978 | O'Brien et al. | 357/19 X |
| 4,144,539 | 3/1979 | Davie et al. | 346/160 |
| 4,153,364 | 5/1979 | Suzuki et al. | 250/205 X |
| 4,175,851 | 11/1979 | Kitamura et al. | 358/300 X |
| 4,233,612 | 11/1980 | Hirayama et al. | 346/160 |
| 4,237,427 | 12/1980 | Holland | 331/94.5 H X |

FOREIGN PATENT DOCUMENTS

2737345 3/1978 Fed. Rep. of Germany ........ 357/18

OTHER PUBLICATIONS

RCA Technical Notes TN No. 1005, Wittke et al., Apr. 1975.
Applied Physics-No. 3(Mar.) 1977 pp. 277282-Preier, et al. "Peltier Cooled PbSe Double-Heterostructure Lasers for IR Gas Spectroscopy".
IBM Technical Disclosure Bulletin-vol. 20, No. 5, Oct. 77, Crow "Integral Source/Receiver Package for Optical Data".

*Primary Examiner*—Stuart N. Hecker
*Attorney, Agent, or Firm*—Fitzpatrick, Cella, Harper & Scinto

[57] ABSTRACT

A semiconductor laser device in which a thermosensitive element exhibiting a resistance variation with temperature is installed at a location more faithfully transmitting the temperature of a semiconductor laser element and the thermosensitive element is connected to a circuit for taking out the output from a photodetector receiving the light from the laser element so that, when a wavelength fluctuation is caused by a temperature variation, information is fed back so that a required quantity of light corresponding to that wavelength is obtained, whereby an optimal quantity of light may always be maintained, and an image recording apparatus using the same.

32 Claims, 22 Drawing Figures

SEMICONDUCTOR LASER DEVICE HAVING A STABILIZED OUTPUT BEAM

BACKGROUND OF THE INVENTION

1. Field of the Invention

This invention relates to a semiconductor laser device whose output beam is made stable, and also to a semiconductor laser device the beam intensity of whose output beam can be detected. The invention further relates to a semiconductor laser device which is suited for use in an electrophotographic image recording apparatus using a photosensitive medium. The invention further relates to an image recording apparatus using the output beam of a semiconductor laser device.

2. Description of the Prior Art

There has heretofore been proposed a semiconductor laser device adopting the so-called auto power control (hereinafter referred to as APC) in which the beam output of a semiconductor laser element is detected and fed back and controlled to thereby maintain the light output intensity of the semiconductor laser element constant.

As an example of the device having such APC function, there has been proposed a semiconductor laser device in which the principal beam (hereinafter referred to as the front beam) of a semiconductor laser element which provides the output of a light source device and the subordinate beam thereof (hereinafter referred to as the rear beam) become identical with respect to power and emission distribution and therefore the rear beam is fed back to a laser driving circuit to thereby control the front beam.

For example, in the device disclosed in U.S. Pat. No. 4,125,777, as shown in FIG. 1 of the accompanying drawings, a light-receiving element 3 for receiving the rear beam 2 of a semiconductor laser element 1 to effect APC is provided and the signal thereof is sent to a separate laser driving circuit so as to control the output of the front beam 4 which provides the original output of a light source device.

In these devices, however, the rear beam emitting surface 5 of the semiconductor laser element 1 is opposed to the light-receiving surface 6 of the light-receiving element 3 and this leads to the following problem.

That is, if the emergence angle of the rear beam 2 with respect to the perpendicular 7 to the rear beam emitting surface 5 of the semiconductor laser element 1 is $\alpha$ and the intensity thereof is $I(\alpha)(W/sr)$, the distribution of $I(\alpha)$ becomes such as indicated by solid line A in FIG. 2 of the accompanying drawings and is similar to gaussian distribution. This entirely holds true with the front beam.

Next, let l(m) be the distance between the rear beam emitting surface 5 and the light-receiving surface 6 and $L(\alpha)$ be the power (illumination) per unit area of the light-receiving surface 6 receiving the rear beam having an emergence angle $\alpha$. Then, $$L(\alpha) = I(\alpha)/l^2 \cos^3\alpha \quad (1)$$

The relation of equation (1) is such as indicated by dotted line B in FIG. 2, from which it is seen that the illumination L(O) of the central portion of the light-receiving surface receiving the peak beam $\alpha=0$ becomes maximum, and L(O) is $$L(O) = I(O)/l^2 \quad (2)$$

As the marginal portion is approached, the illumination of $\cos^3\alpha$ is reduced in addition to the reduction in $I(\alpha)$. Accordingly, the light-receiving surface 6 in the device of the aforementioned U.S. patent has a great difference in illumination between the central portion and marginal portion thereof, and this leads to the following problem.

Generally, if the illumination of the light-receiving surface is $L(W/m^2)$ and the terminal voltage (output voltage) is $E(V)$, the output characteristic of the light-receiving element does not always become linear, but is divided into a straight range G and non-straight ranges F and H, as shown in FIG. 3 of the accompanying drawings.

In the straight range G, the terminal voltage E increases in proportion to an increase in illumination L. However, in the non-straight ranges F and H, the terminal voltage E is not proportional to an increase in illumination L and particularly, in the range F, the S/N ratio of the light-receiving element is reduced.

Accordingly, if the illumination difference between the central portion and marginal portion of the light-receiving surface 6 is great as in the device of the aforementioned U.S. patent, the illumination in the central portion becomes the range H of FIG. 3 and conversely, the illumination in the marginal portion becomes the range F. As a result, the output voltage of the light-receiving element 3 is not proportional to the illumination and it may become impossible to effect highly accurate detection of the quantity of light.

In addition to such a problem, the device as shown in FIG. 1 encounters a problem that the rear beam 2 is reflected to the light-receiving surface of the light-receiving element 3 and mixes and interferes with the front beam 4 and moreover, when the front beam is imaged, the ghost of the rear beam reflected by the light-receiving surface appears.

Heretofore, in the field of light communications and the like, semiconductor laser elements have been widely used as the light source. In such cases, the aforementioned APC is often adopted.

FIG. 4 of the accompanying drawings illustrates such method. The light output of a semiconductor laser element 11 is received by a photodetector 12 and amplified by an amplifier 13, whereafter it is fed back to a laser driving circuit 14 and controlled so that the output of the photodetector 12 is always constant. However, where the output light from the semiconductor laser element is used for the image recording or the like, the wavelength dependency of the sensitivity of a photosensitive medium irradiated with the laser light raises a great problem. In a device using a laser such as conventional He-Ne laser having a short wavelength, the spectrum sensitivity of the photosensitive medium near the laser wavelength is often flat, thus permitting the conventional APC system to be adopted. On the other hand, the semiconductor laser emitted from the semiconductor laser element is of a wavelength of about 8000 Å which is in the near-infrared range as compared with the He-Ne laser and therefore, the photosensitive medium usually used is low in sensitivity. Therefore, where a semiconductor laser is used in such an image recording apparatus, it is often the case that the photosensitive medium is sensitized for use. However, even if it is sensitized, the spectrum sensitivity thereof cannot be made flat even in the semiconductor laser wavelength range in terms of the stability of the image quality and the durability of the photosensitive medium, and still has dependency on the wavelength as shown in FIG. 5 of the accompanying drawings.

It is therefore necessary to control the quantity of light depending on the wavelength of the semiconductor laser element used and if a wavelength fluctuation occurs during the operation of the semiconductor laser element, no good image can be obtained by the conventional APC system.

Describing an example, a semiconductor laser has a temperature coefficient of wavelength of 2.5–3.0 Å and if there is a temperature variation of 30° C., it creates a wavelength variation of maximum 90 Å. Thus, as the wavelength dependency of the sensitivity of the photosensitive medium is higher, the image obtained becomes worse in quality.

On the other hand, there is a method of using a semiconductor laser element at a predetermined temperature with the aid of cooling means such as Peltier element, but this method employs a number of components and is high in cost.

SUMMARY OF THE INVENTION

It is a principal object of the present invention to provide a semiconductor laser device which eliminates the above-noted disadvantages peculiar to the prior art and an image recording apparatus in which a photosensitive medium is scanned by the output beam of such laser device.

It is a first object of the present invention to provide a semiconductor laser device in which the rear beam does not mix with the front beam and moreover, highly accurate beam output control is possible.

It is a second object of the present invention to provide a semiconductor laser device in which a thermosensitive element such as a thermistor exhibiting a resistance variation with temperature is installed at a location more faithfully transmitting the temperature of a semiconductor laser element and the thermosensitive element is connected to a circuit for taking out the output from a photodetector receiving the light from the laser element so that, when a wavelength fluctuation is caused by a temperature variation, information is fed back so that a required quantity of light corresponding to that wavelength is obtained, whereby an optimal quantity of light may always be maintained, and an image recording apparatus using the same.

It is a third object of the present invention to provide an image recording apparatus which effects recording on a photosensitive medium by the output beam of a semiconductor laser element and in which an optical filter having a transmission factor distribution corresponding to the spectrum sensitivity characteristic of the photosensitive medium used is disposed in front of a detector for detecting the quantity of light from the laser element, thereby compensating for a variation in sensitivity of the photosensitive medium caused by the shift of the oscillation wavelength based on an ambient temperature variation of the laser element.

Other objects of the present invention will become apparent from the following detailed description taken in conjunction with the accompanying drawings.

DESCRIPTION OF THE PREFERRED EMBODIMENTS

Embodiments of the present invention will hereinafter be described in detail.

Figure 6:
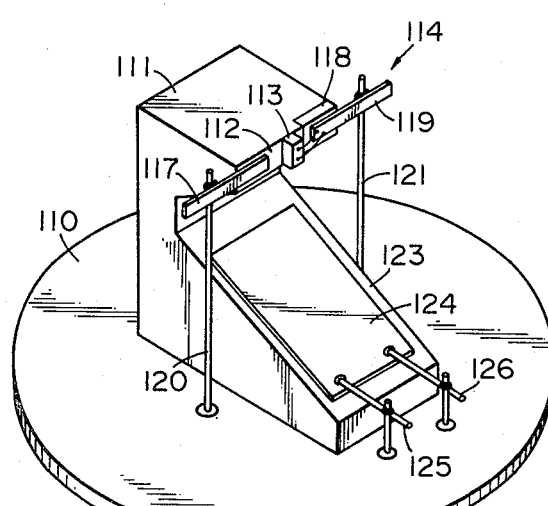
FIG. 6 is a schematic perspective view showing a first embodiment of the semiconductor laser device according to the present invention.
Figure 6:
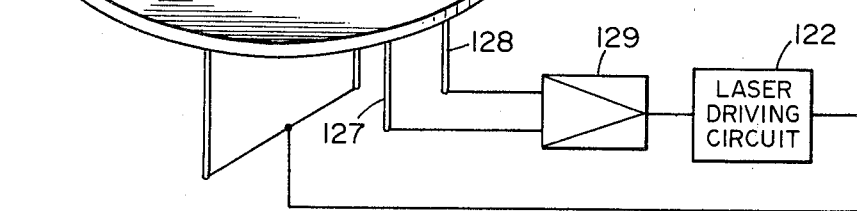
Figure 7:
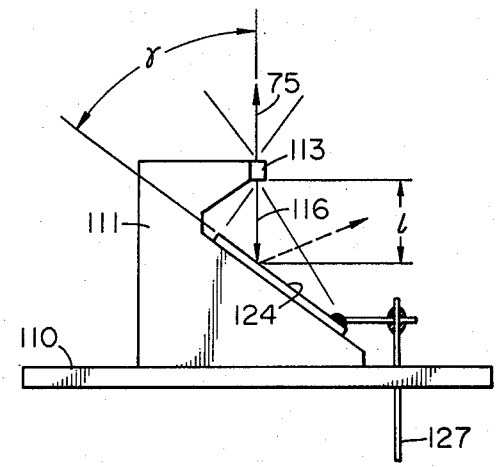
FIG. 7 is a side view showing the essential portions of the FIG. 6 device.

FIGS. 6 and 7 show a first embodiment of the semiconductor laser according to the present invention.

In this embodiment, an electrically conductive mount 111 is fixed on a disc-like base 110 generally made of a metal such as steel or copper having a good heat radiation property, and a semiconductor laser element 113 is joined to the vertical surface 112 of the mount 111 adjacent to the top end thereof in a conventional manner. The semiconductor laser element 113 is operated by a driving unit 114, whereby the semiconductor laser element emits a front beam 115 upwardly and a rear beam 116 downwardly, as shown in FIG. 7.

As shown in FIG. 6, the driving unit 114 comprises a plus electrode 117 joined to the vertical surface 112 of the mount 111, a minus electrode 119 joined to the vertical surface with an insulating plate 118 interposed therebetween, leads 120 and 121 connected to the respective electrodes and extending through the base 110 with an insulating material interposed between the leads and the base, and a laser driving circuit 122 connected to these leads. The driving unit 114 operates the semiconductor laser element 113 in a known manner (for example, described in U.S. Application Ser. No. 822,340 filed Aug. 5, 1977).

On the other hand, the mount 111 is formed with an inclined surface 123 in the lower portion thereof, and a light-receiving element 124 is mounted on the inclined surface. Thus, the light-receiving element 124 is inclined with respect to the beam emitting surface of the semiconductor laser element 113 and in its inclined state, it receives the rear beam from this semiconductor laser element. Also, the light-receiving element 124 is connected to an amplifier 129 through terminals 125, 126 and leads 127, 128, the amplifier 129 being connected to the aforementioned laser driving circuit 122. Thus, the light-receiving element 124 feeds back the output of the rear beam 116 to the laser driving circuit 122 and controls the front beam 115 and rear beam 116 so that the outputs thereof assume a predetermined value.

Now, in the apparatus of this embodiment, when the semiconductor laser element 113 is operated, as shown in FIG. 7, the rear beam 116 of the same output as the front beam 115 impinges on the light-receiving element 124 and part of the rear beam is reflected by the inclined light-receiving surface in a direction different from the front beam 115.

Here, let $\gamma$ be the angle between the perpendicular to the beam emitting surface of the semiconductor laser element 113 and the light-receiving element 124, $I_o$ be the intensity of the peak beam of the rear beam 116, and l be the distance between the light-receiving surface portion receiving $I_o$ and the rear beam emitting surface. Then, the illumination $L_o$ of the light-receiving surface portion receiving the peak beam is expressed as $$L_o = I_o/l^2 \sin \gamma \qquad (3)$$

When this is compared with equation (2), it is seen that the illumination is lower by $\sin \gamma$ due to the light-receiving element 124 being inclined. Accordingly, the output of the light-receiving element 124 can be prevented from becoming the area of the non-linear range H of the sensitivity curve shown in FIG. 3, thus enabling accurate light quantity detection to be accomplished. Also, since the light-receiving element 124 is mounted on the inclined surface 123, the reflected beam of the rear beam travels in a direction different from the front beam and thus, occurrence of ghost can be prevented.

Figure 8:
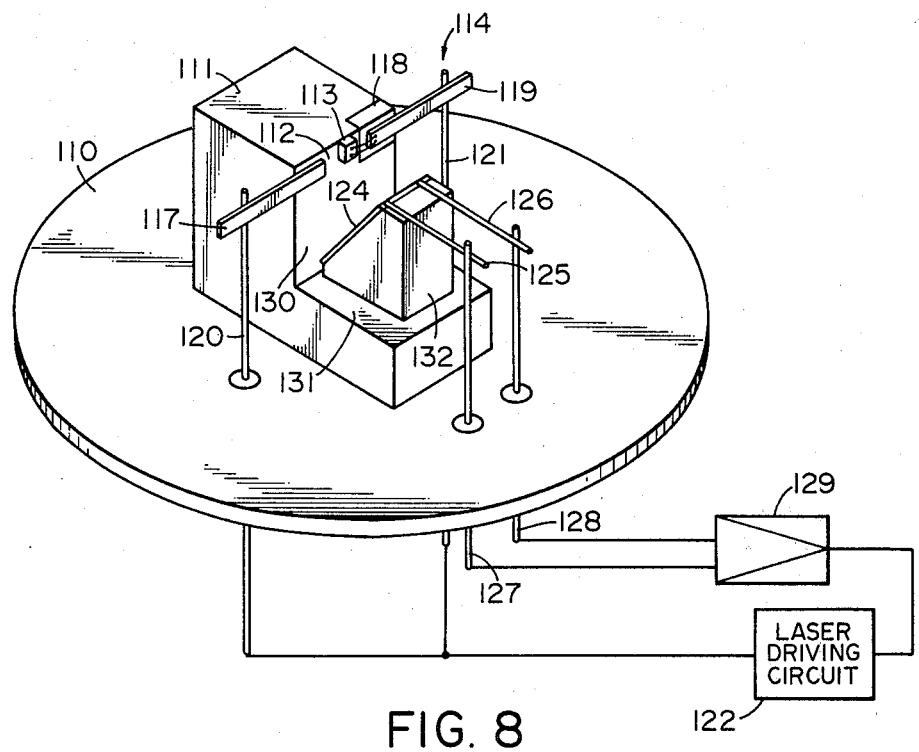
FIG. 8 is a schematic perspective view showing a second embodiment of the present invention.
Figure 9:
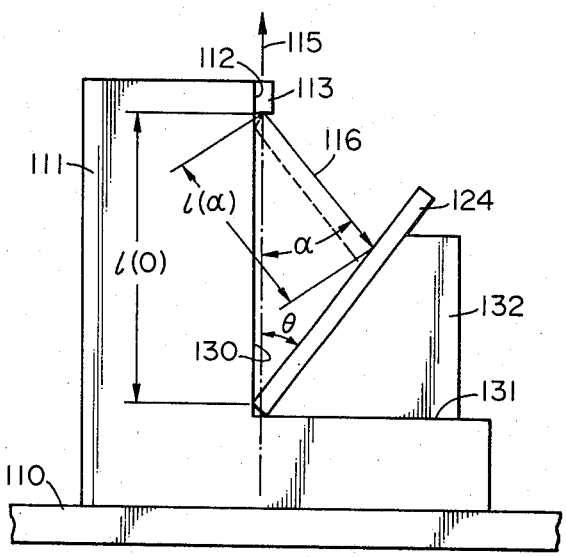
FIG. 9 is a side view showing the essential portions of the FIG. 8 embodiment.

A second embodiment of the apparatus according to the present invention is shown in FIGS. 8 and 9.

In this embodiment, a beam reflecting surface 130 extends downwardly from the vertical surface 112 of the mount 111 to which the semiconductor laser 113 is joined, and there is formed a horizontal surface 131 which intersects the beam reflecting surface. A light-receiving element 124 is mounted on an inclined bed 132 fixed on the horizontal surface 131.

The direction of inclination of the light-receiving element 124 is opposite to that in the first embodiment, and the light-receiving element 124 is inclined so that its light-receiving surface portion which receives the peak beam of the rear beam 116 is more remote from the beam emitting surface of the semiconductor laser element 113 than the other light-receiving surface portion.

In this embodiment, one half of the rear beam from the semiconductor laser element 113 is reflected by a beam reflecting surface 130 and impinges on the light-receiving element 124 while the remaining one half of the rear beam directly reaches the light-receiving element 124. Therefore, it will suffice if the area of the light-receiving element 124 has a size large enough to cover one half of the beam emission width.

This embodiment is identical to the first embodiment in the other points.

Description will now be made of a case where the semiconductor laser element 113 in this embodiment has been operated.

As shown in FIG. 9, let $\theta$ (constant) be the angle between the perpendicular to the beam emitting surface of the semiconductor laser element 113 and the light-receiving element 124 and $\alpha$ (variable) be the emergence angle thereof. Then, the distance $l(\alpha)$ over which the rear beam travels before reaching the light-receiving element 124, the intensity of the rear beam having the emergence angle $\alpha$, and the illumination of the light-receiving surface of the light-receiving element 124 which receives the rear beam may all be expressed as functions of the emergence angle $\alpha$. Here, let $l(\alpha)$ be the distance over which the rear beam 116 travels before it reaches the light-receiving element 124 from the semiconductor laser element 113, $I(\alpha)$ be the intensity of the rear beam having the emergence angle $\alpha$, and $L(\alpha)$ be the illumination of the light-receiving surface of the light-receiving element 124 which receives the beam of intensity $I(\alpha)$. Then, $L(\alpha)$ is expressed as $$L(\alpha) = \sin(\theta + \alpha)/[l(\alpha)]^2 \qquad (4)$$

In this equation, $\sin(\theta+\alpha)$ in the right side is increased as $\alpha$ becomes greater, because $\theta$ is constant $(\theta+\alpha<90°)$. Also, as will be seen in FIG. 9, $l(\alpha)$ becomes smaller as $\alpha$ becomes greater. Accordingly, when $\alpha$ becomes greater, $\sin(\theta+\alpha)/[l(\alpha)]^2$ is increased.

Figure 1:
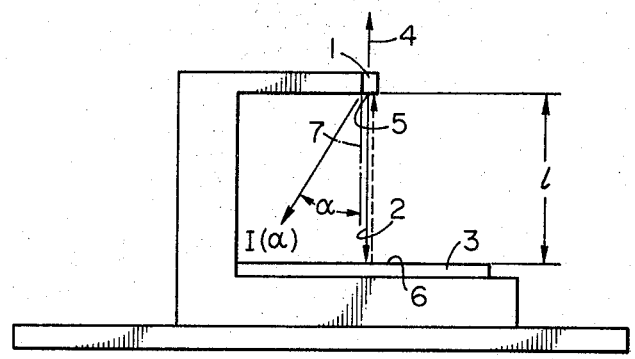
FIG. 1 is a front view schematically showing the arrangement of a conventional semiconductor laser device.
Figure 2:
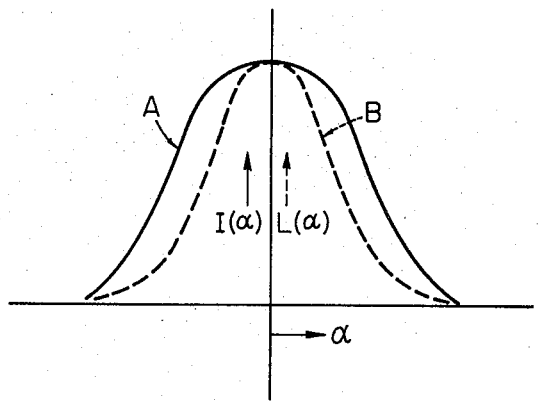
FIG. 2 is a graph illustrating the light output and illumination distribution of the laser on the light-receiving surface by the semiconductor laser element of FIG. 1.

The following will be understood from this. That is, the intensity $I(\alpha)$ of the rear beam decreases with an increase in $\alpha$ as indicated by the curve A of FIG. 2, but since $\sin(\theta+\alpha)/[l(\alpha)]^2$ increases, the variation in the illumination $L(\alpha)$ on the light-receiving element 124 becomes very much smaller than the variation in $I(\alpha)$. As a result, the illumination difference between the light-receiving surface portions of the light-receiving element 124 becomes smaller, thus enabling the light-receiving element to be used in the linear range of the output characteristic shown in FIG. 3.

Also, $l(\alpha)$ may be mathematically expressed as $$l(\alpha) = \frac{\tan \theta}{\sin \alpha + \cos \alpha \tan \theta} l(O)$$

and if this is substituted in equation (4), $$L(\alpha) = \frac{\sin(\theta + \alpha)}{[l(O)]^2} \left( \frac{\sin^\alpha + \cos^\alpha \tan\theta}{\tan\theta} \right)^2 I(\alpha) \tag{5}$$

Figure 3:
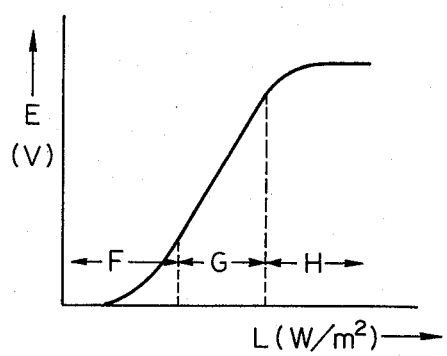
FIG. 3 is a graph illustrating the output characteristic of the light-receiving element of the semiconductor laser device.
Figure 4:
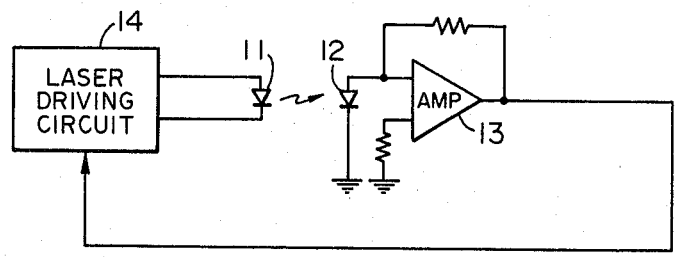
FIG. 4 is a diagram of a circuit for controlling the quantity of light of the semiconductor laser element.

By determining in this equation the intensity $I(\alpha)$ of the rear beam of the semiconductor laser element 113 and the maximum incidence angle $\alpha$ of the necessary beam, it is possible to derive the moderate value of $\theta$ and the maximum distance $l(O)$ between the light-receiving element 24 and the rear beam emitting surface in order that the illumination $L(\alpha)$ of the light-receiving element may fall within the linear range G of the light-receiving element characteristic shown in FIG. 3.

Figure 10:
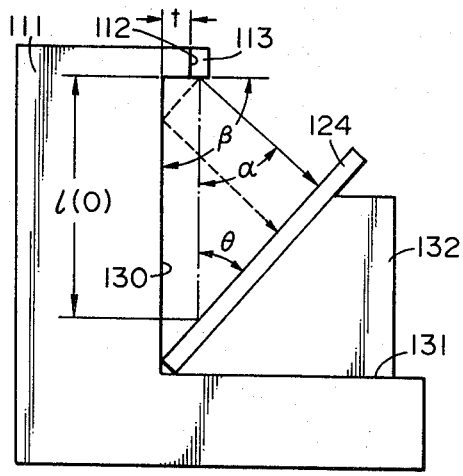
FIG. 10 is a side view showing the essential portions of a third embodiment of the present invention.

FIG. 10 shows a third embodiment which is modified over the above-described second embodiment.

In FIG. 10, it is preferable in machining of the mount that the vertical surface 112 of the mount 111 and the beam reflecting surface 130 be a continuous surface as in the second embodiment, but a step difference t may be provided therebetween if the angle $\beta$ formed between the rear beam emitting surface of the semiconductor laser element 113 and the beam reflecting surface 130 is approximately a right angle.

According to the experiment, where $l(O)=10$ mm and $\theta=45°$, a result which satisfies the objects of the present invention has been obtained even if t = 3 mm and $\beta=70-110°$.

Figure 11:
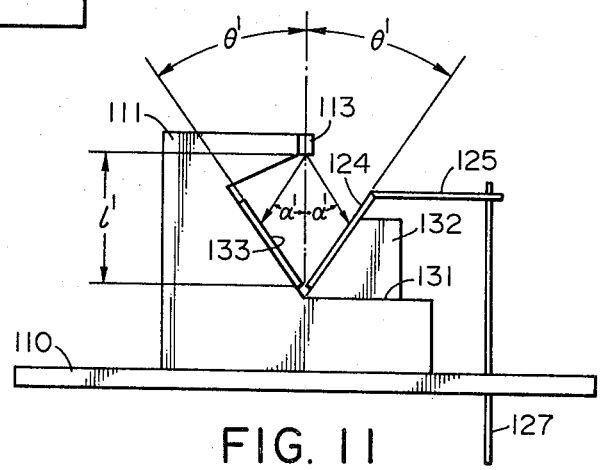
FIG. 11 is a side view showing the essential portions of a fourth embodiment of the present invention.

FIG. 11 shows a fourth embodiment of the present invention.

In this embodiment which is modified over the second embodiment shown in FIGS. 8 and 9, a second light-receiving element 133 is provided instead of the beam reflecting surface 130.

That is, a plurality of light-receiving elements are employed and each of them is inclined by $\theta'$ so that they are symmetrical with respect to the perpendicular to the beam emitting surface of the semiconductor laser element 113. This angle of inclination $\theta'$, the emergence angle $\alpha'$ and the distance $l'$ between the rear beam emitting surface and the light-receiving elements 124, 133 are similar in effect to $\theta$, $\alpha$ and $l$ in the second embodiment.

As has been described above, according to the present invention, the light-receiving element is inclined and therefore, the light-receiving element can be used in the linear range of the characteristic curve shown in FIG. 3 and this leads to more accurate measurement of the laser beam by the light-receiving element as well as highly accurate output control. Also, the rear beam reflected by the light-receiving surface of the light-receiving element does not mix with the front beam and this leads to the possibility of preventing occurrence of ghost and achieving the intended purpose.

As already described, the oscillation wavelength of the semiconductor laser element shifts due to a variation in ambient temperature. The wavelength shift is not preferable in imparting a great adverse effect to the output image of an image recording apparatus using a photosensitive medium variable in sensitivity.

Figure 12:
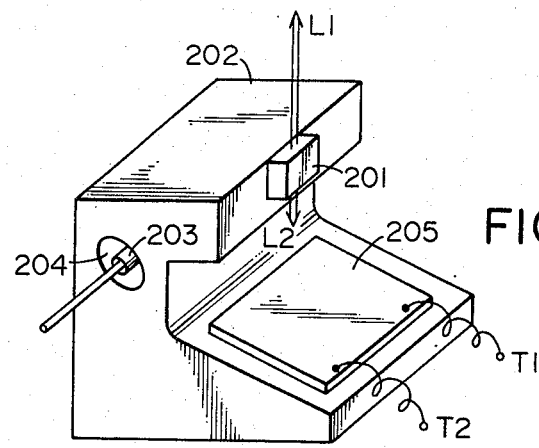
FIG. 12 is a perspective view of a semiconductor laser device provided with a temperature detector.
Figure 13:
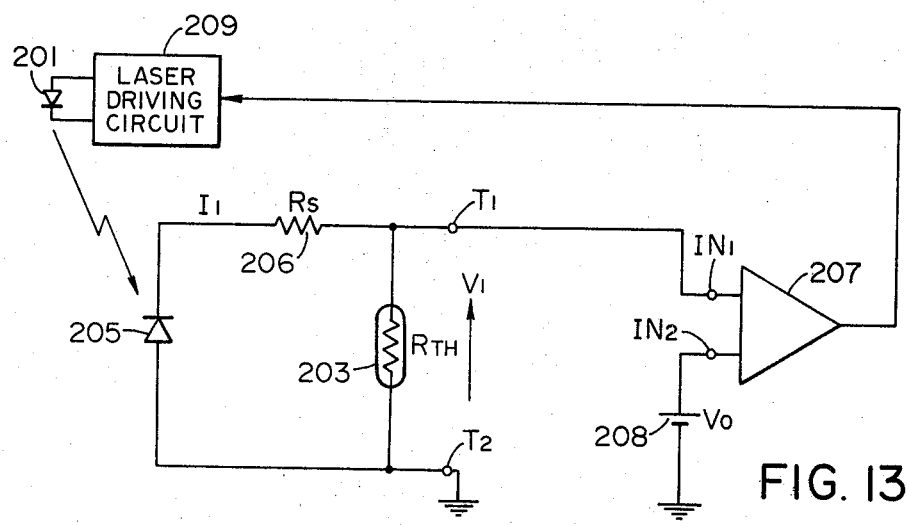
FIG. 13 is a diagram of the light quantity controlling circuit of the FIG. 12 semiconductor laser device.

Some embodiments for compensating for this will hereinafter be shown. FIGS. 12 and 13 show a first one of such embodiments. In FIG. 12, reference numeral 201 designates a semiconductor laser element which emits a front beam $L_1$ and a rear beam $L_2$, reference numeral 202 denotes a laser mount (support member) formed of a metal and supporting the semiconductor laser element thereon, and reference numeral 203 designates a thermosensitive element, for example, a thermistor, which exhibits a resistance variation in response to a temperature variation of the semiconductor laser element. The thermosensitive element 203 is secured to a hole provided in the support member 202 by a heat conductive adhesive 204, but alternatively it may be fixed onto the semiconductor laser element 201. Designated by 205 is a photodetector which receives the laser beam of the semiconductor laser element which is not used for the recording, namely, the rear beam $L_2$. The photodetector 205 is fixedly disposed on the support member 202 with the light-receiving surface thereof being inclined so as to be non-perpendicular to the rear beam $L_2$.

As shown in FIG. 13, a resistor 206 (resistance value $R_s$) is connected in series with the photodetector 205, and the thermosensitive element 203 (resistance value $R_{TH}$) is parallel-connected to the photodetector 205 and resistor 206. The input $IN_1$ of an error amplifier is connected to the terminal $T_1$ of the photodetector 205, and a reference voltage source 208 is connected between the error amplifier $IN_2$ and a terminal $T_2$.

When the rear beam $L_2$ from the laser element 201 impinges on the photodetector 205, a current $I_1$ flows. Thereupon, the terminal voltage $V_1$ of the thermistor 203 becomes $I_1 \cdot R_{TH}$ and is compared with a reference voltage $V_O$, and a signal is fed back to a laser driving circuit 209 which drives the laser element 201 so that $V_1$ becomes $V_O$, thus controlling the current supplied to the laser element 201.

In the semiconductor laser device of the present invention, the laser output is always corrected to an optimum value by the amount of temperature variation of the thermosensitive element 203 even if the wavelength is fluctuated by a temperature rise of the semiconductor laser element 201 to vary the required quantity of light.

Figure 14:
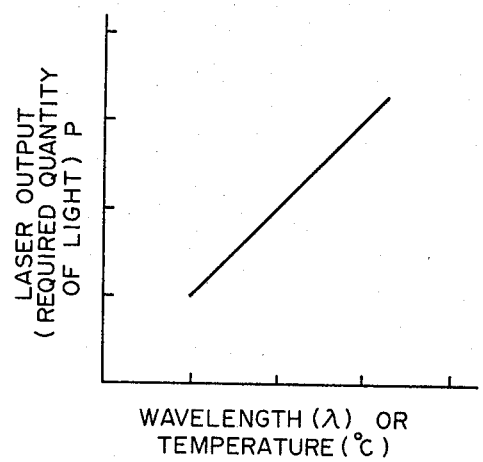
FIG. 14 is a graph illustrating the laser output or temperature versus wavelength characteristic.

More particularly describing, the sensitivity of the photosensitive medium (later described) irradiated with the front beam is first measured and the laser wavelength λ (abscissa) versus the required quantity of light P for the photosensitive medium to obtain a required sensitivity is sought after. An example thereof is shown in FIG. 14. The abscissa of FIG. 14 may also represent the temperature of the laser element.

Next, the temperature coefficient Δλ/ΔT of the wavelength of the semiconductor laser is sought after. From these results, the amount of fluctuation of the wavelength in the used temperature range and further, the amount of variation in the required quantity of light can be known. Therefore, the required quantity of light should only be corrected by the amount of variation in wavelength.

This correction is as follows:

Since the circuit operates so that the relation that $I_1 \cdot R_{TH} = V_O$ is always maintained, the resistance value $R_{TH}$ of the thermistor should only be varied by temperature so as to correct the FIG. 14 sensitivity curve of the photosensitive medium. For that purpose, the temperature coefficient (B constant) of the resistance of the thermistor should only be sought after in the used temperature range, for example, 10°–40° C. (283° K.–313° K.).

Now, if $\dfrac{R_{TH} \, 10° \text{ C.}}{R_{TH} \, 40° \text{ C.}} = 2.0$,

B is known to be 2000 K. from $$\frac{R_{TH} \; 10° \text{ C.}}{R_{TH} \; 40° \text{ C.}} = \text{EXP}\left(B \frac{1}{T_1} - \frac{1}{T_2}\right),$$
$$283° \text{ K. } 313° \text{ K.}$$

where EXP is exponential, that is, $e^B(1/T_1 - 1/T_2)$.

Thus, if a thermistor having B constant of 2000 K. is installed in the laser mount, a proper quantity of light may be obtained.

An arbitrary numerical value cannot be obtained for the B constant of the thermistor, but it is possible to obtain various B constants if the thermistor and a fixed resistor are combined and therefore, the requirement can be sufficiently coped with even if the laser element has a temperature coefficient of wavelength of 2.5°–3.0 Å/°C. and even if the drum sensitivity differs. Also, the variation in resistance of the thermistor with temperature is not linear, whereas this offers substantially no problem in the temperature fluctuation of about 30° C.

As described above, according to the present embodiment, even if the required quantity of light fluctuates with a wavelength variation of the semiconductor laser element, the laser output can always be shifted to a proper value by the photodetector and thermosensitive element. In the present embodiment, the quantity of light of the rear beam is detected, but of course, the quantity of light of the front beam may be measured at a predetermined timing.

Description will now be made of a second embodiment which compensates for the sensitivity variation of the photosensitive medium caused by the variation in oscillation wavelength of the semiconductor laser element based on a variation in ambient temperature.

Figure 15:
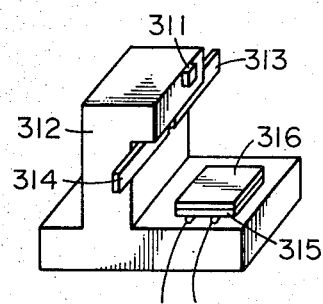
FIGS. 15 and 16 are a perspective view and a side view, respectively, showing a semiconductor laser device provided with an optical filter according to the present invention.
Figure 16:
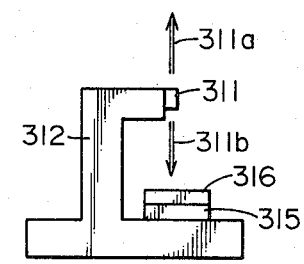

FIG. 15 shows the basic construction of the semiconductor laser element of the present embodiment, and FIG. 16 shows a cross-section thereof. The semiconductor laser element 311 is attached to a heat sink 312 of copper. The electrode of the semiconductor laser element 311 is bonded to metal electrodes 313 and 314 insulated from the heat sink 312. The rear beam 311b from the semiconductor laser element 311 impinges on a photodetector 315 through a filter 316. The spectrum transmission factor of the filter is designed in accord with the spectrum sensitivity of a photosensitive medium (later described) which is irradiated for recording with the front beam 311a from the semiconductor laser element 311, as shown by 318 in FIG. 17. The curve 318 also represents the sensitivity curve of the photosensitive medium. On the other hand, the spectrum sensitivity of the photodetector 315, if it is one of PIN construction, will scarcely be dependent on the wavelength in the near-infrared range, as indicated by a dotted line 317 in FIG. 17. Accordingly, the required quantity of light which should be emitted from the semiconductor laser element 311 must have such a characteristic as shown by a dot-and-dash line 319 in FIG. 17 (a to b of the dot-and-dash line 319 represents the same characteristic as the straight line of FIG. (4). Now, let $I_o(\lambda)$ be the quantity of light emitted from the laser and $T(\lambda)$ be the transmission factor of the filter. Then, the quantity of light I impinging on the photodetector 315 is $$I(\lambda) = T(\lambda) \cdot I_o(\lambda)$$

Further, if the ambient temperature varies and the laser wavelength changes to $\lambda_1$, then $$I(\lambda_1) = T(\lambda_1) I_o(\lambda_1)$$

Here, if feedback is exerted so as to ensure the quantity of light $I(\lambda)$ impinging on the photodetector 315 to be constant irrespective of $\lambda$ (this may be done in a manner similar to the conventional APC system), $$I(\lambda) = T(\lambda) \cdot I_o(\lambda) = I(\lambda_1) = T(\lambda_1) I_o(\lambda_1)$$

$$\therefore I(\lambda_1) = T(\lambda)/T(\lambda_1) \cdot I(\lambda)$$

and thus, the light energy impinging on the photosensitive medium is corrected in its quantity as if the sensitivity dependency of the photosensitive medium were corrected.

The spectrum transmission factor characteristic of such filter becomes correctable, as already described, by letting it have the same characteristic as the sensitivity curve of the photosensitive medium used. However, if the wavelength range actually used is only a narrow range, for example, the range from a to b in FIG. 17, then the transmission factor at the point a in FIG. 17 can be designed so as to be 100%. The filter transmission factor in this case may be rendered to a characteristic in which the curve from a to b has been normalized with a as 100%. By so designing, correction becomes moderately possible without imposing more than necessary burden upon the laser element.

Such filter can be constituted by an optical absorbing filter. However, commercially available filters are limited in variety and therefore, the intended transmission factor distribution cannot be obtained in some cases.

In such cases, the filter may be freely designed by the use of a dielectric multi-layer film. For example, a filter conforming to the required sensitivity curve distribution of the photosensitive medium can be formed by a material comprising magnesium fluoride ($MgF_2$) and zirconium dioxide ($Z_rO_2$) alternately evaporated at an optical film thickness nd (n: refractive index, d: film thickness) 235.8 nm in multi-layer with $BK_7$ as the base. To cite an instance, a filter conforming to the FIG. 17 sensitivity curve 318 of the photosensitive medium could be made by alternately disposing seven layers of $Z_rO_2$ (n=2.07) and $M_gF_2$ (n=1.38) each on a glass substrate $BK_7$ and finally depositing one more layer of $Z_rO_2$ by evaporation.

Figure 18:
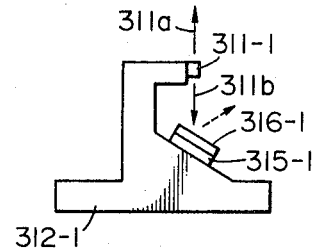
FIGS. 18 and 19 are a side view showing another embodiment provided with an optical filter according to the present invention.

FIG. 18 shows another embodiment of the present invention in which a filter 316-1 and a photodetector 315-1 are inclinedly disposed so as to be non-perpendicular to the rear beam 311b in order that the return of the light reflected thereby to the laser may be avoided. This is done by taking it into account that if the reflected light returns to the laser element, the characteristic becomes unstable due to the self-coupling phenomenon, as is well known.

In FIG. 18, parts similar to those in FIGS. 15 and 16 are identified by similar reference numerals with suffix −1 added thereto. Where the photosensitive characteristic of such photosensitive medium becomes irregular or where it is desired to expect a precise correction effect, it is originally necessary to interchange the filter 316, but in another embodiment of the present invention, such correction is made possible by providing the filter with an adjusting mechanism.

Figure 19:
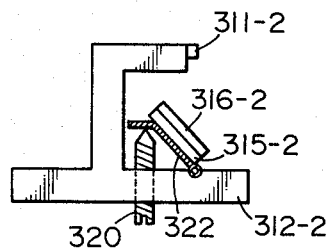

FIG. 19 shows such an embodiment. In this embodiment, a filter 316-2 and a photodetector 315-2 are disposed on a rotatable support member 322 and the incidence angle of the rear beam upon the photodetector 315-2 can be varied by an adjusting screw 320.

In FIG. 19, members similar to those in FIGS. 15 and 16 are given similar reference numerals. Generally, the transmission factor curves of an optical filter and a dielectric filter more or less shift if the incidence angle of the light beam incident thereon is varied. This is because the length of the optical path passing through the filter is varied by the incidence angle. Accordingly, if the filter is preset in accordance with the irregularity of the photosensitive medium, it will later be required only to vary the angle of the filter with respect to the rear beam and it will not be necessary to prepare a variety of filters but highly accurate light quantity control will be made possible by only one kind of filter.

Figure 20:
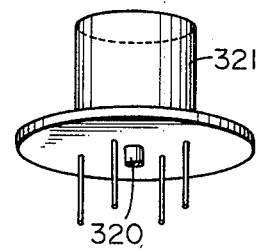
FIG. 20 is perspective view showing another embodiment provided with an optical filter according to the present invention.

FIG. 20 shows the light source of the present invention sealed and enclosed in a TO package 321. An adjusting mechanism comprising the aforementioned screw 320 is externally operable.

As described above, the light quantity control by the wavelength shift of the semiconductor laser can be accomplished with high accuracy by disposing the filter in front of the photodetector. Again in the present embodiment, the quantity of light of the rear beam is detected, but of course, the optical filter as previously described may be provided in the portion irradiated with the front beam. This is because the relation between the quantity of light of the front beam and that of the rear beam is linear. However, the rear beam has a merit in that it can always be detected.

As has been described above in connection with a few embodiments, according to the present invention, it is possible always to obtain a good image even if the temperature of the semiconductor laser element is varied by environmental fluctuations or the self-heating of the semiconductor laser element. Also, as a matter of course, the light quantity detector can detect even a variation in quantity of light of the ordinary semiconductor laser element accompanying no temperature variation and therefore, a necessary and sufficient quantity of light can always be imparted to the photosensitive medium.

Figure 5:
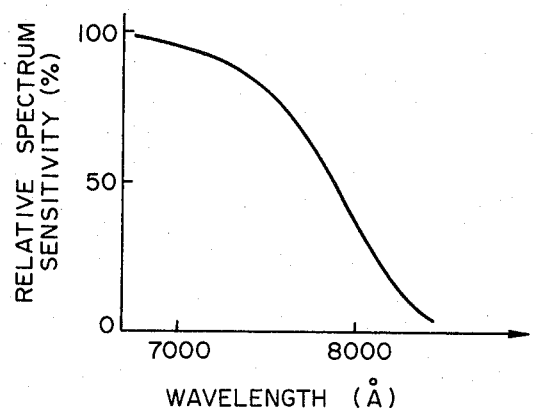
FIG. 5 is a graph illustrating the wavelength dependency characteristic of a photosensitive medium.
Figure 17:
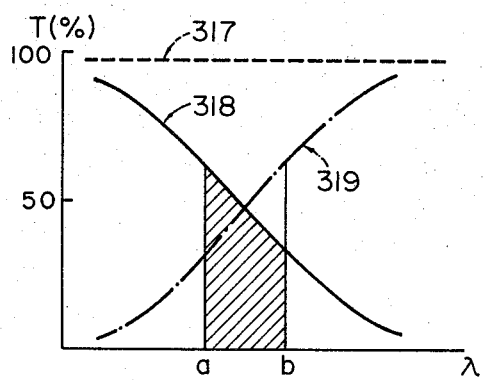
FIG. 17 is a graph illustrating the wavelength versus required quantity of light for the photosensitive medium to obtain a predetermined sensitivity.
Figure 21:
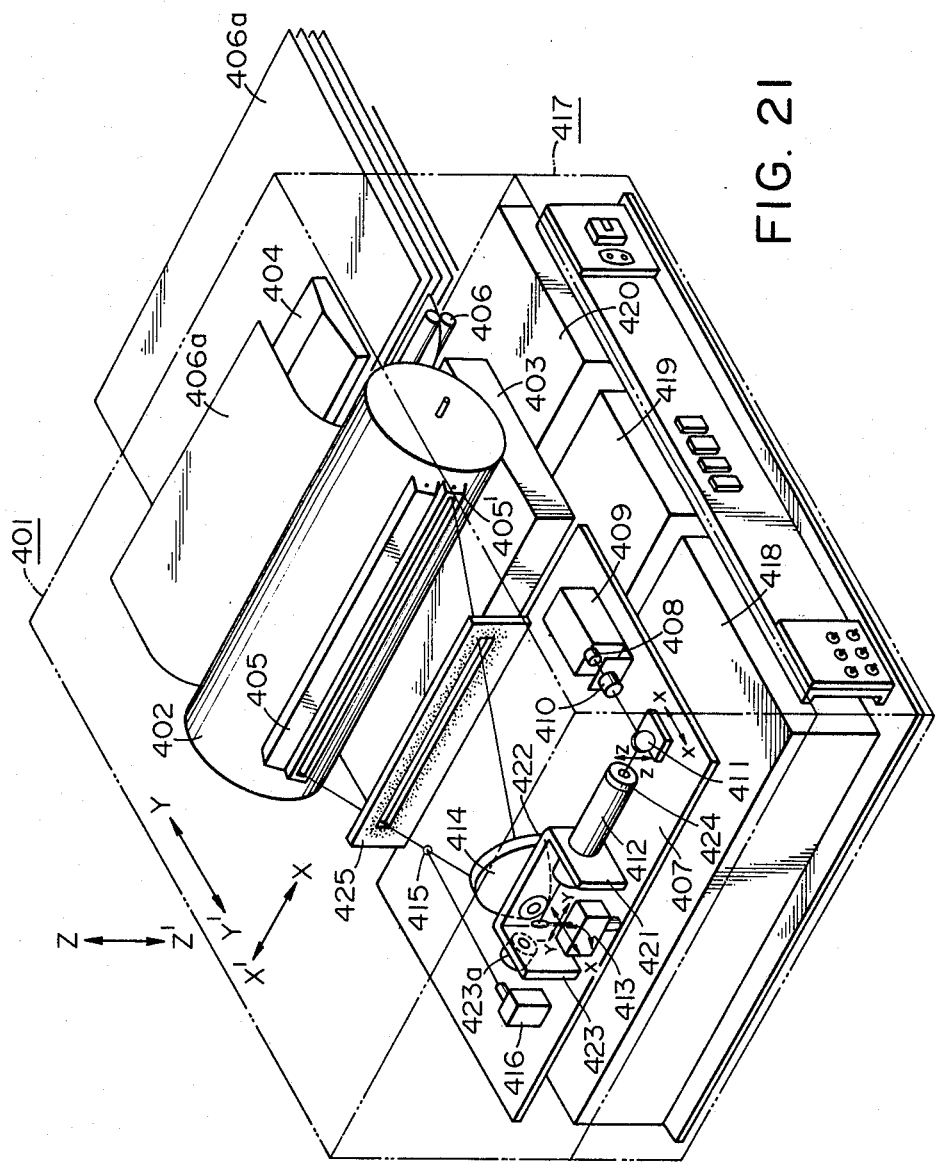
FIG. 21 is a perspective view of an image recording apparatus using the semiconductor laser element.

Detailed description will now be made of an example of the image recording apparatus with which the abovedescribed semiconductor laser may suitably be used. The laser recording apparatus will be described with reference to FIG. 21. Reference numeral 401 designates a recording portion utilizing the electrophotographic process which comprises a photosensitive drum 402, a developing device 403, a heat fixing device 404, a charger 405, a paper feeding mechanism 406 and recording paper 406a. An electronic latent image formed on the surface of the photosensitive drum 402 by the conventional electrophotographic process on the basis of the image light is developed into a visible image by the charger 405 and developing device 403 and further, the image based on said latent image is printed on the recording paper 406a fed by the paper feeding mechanism 406. The photosensitive drum 402 is a three-layer photosensitive medium as described in U.S. Pat. Nos. 4,071,361 and 3,666,363 and exhibits the characteristic as shown in FIGS. 3, 5 or 17. The photosensitive layer thereof is sensitized by doping CdS with an impurity such as copper, chlorine or the like in order that it may be used in a long wavelength range. Alternatively, Se doped with Te may be used. Various optical elements and an optical supporting bed 407 for mounting said optical elements thereon are contained in the recording portion 401. On the optical supporting bed 407, there is disposed a laser driving unit 409 for driving the semiconductor laser device 408 containing therein a semiconductor laser element which is a light source for imparting an image information beam to the photosensitive drum 402, a collimater lens 410 for collimating the beam which expands after emitting from said laser element, a mirror 411 for bending the light beam passed through the collimater lens 410, a beam expander lens 412 for expanding the diameter of the beam reflected by the mirror 411, a galvano mirror scanner 413 for scanning the beam on the photosensitive drum 402, an image forming lens 414 for causing the light beam scanned by the scanner 413 to be imaged on the surface of the photosensitive drum, a beam position detecting mirror 415 for reflecting the scanning beam emergent from the image forming lens 414, and a beam position detecting device 416 for detecting the light beam from the mirror 415 and generating a head-out signal. In a lower case 417, there is contained a power source portion 418, a sequence control circuit portion 419 and an image signal control circuit portion 420. On the surface of the optical supporting bed 407, a plate 421 having a mounting hole for the expander lens 412, a plate 422 having a mounting hole for the image forming lens and a plate 423 having an optical axis setting hole and provided with a photodetector 423a at the back side of the hole are mechanically positioned and fixed so that the centers of said holes lie optically on a straight line.

A disc 424 having an optical axis setting hole is removably fitted to the fore end of the expander lens 412 so that the center of said hole is coincident with the optical axis of the expander lens 412. A fluorescent material excited by a light of wavelength 8,000-9,000 Å to emit a visible light is provided on the entire peripheral area of the holes in said plate 423 and disc 424.

By removing the galvano mirror scanner 413 and by causing the image of the laser beam emergent from the expander lens 412 to be projected upon the surface of the fluorescent material provided on the plate 423, the position of the laser beam image may be observed. Making the direction of the laser beam parallel to the optical axis of the expander lens 412 is accomplished by rotating the reflecting surface of the mirror 411. All the laser beam is caused to pass through the holes in the plate 423 and disc 424 by the aforementioned optical path adjusting means, as a result of which the output of a photodetector 423a provided on the plate 423 becomes maximum. By knowing the output of the photodetector 423a, it can be confirmed that the optical path has been properly set. On the surface of the optical supporting bed 407 between the image forming lens 414 and the photosensitive drum 402, a plate 425 having a slot for passing the scanning beam therethrough is mechanically positioned and fixed so that the center of the shorter side of said slot is coincident with the center of the scanning plane of the image forming lens 414. The aforementioned fluorescent material is disposed peripherally of said slot and, by the light emission of the fluorescent material on the plate 425, the position of the scanning beam on the plate 425 may be detected.

Figure 22:
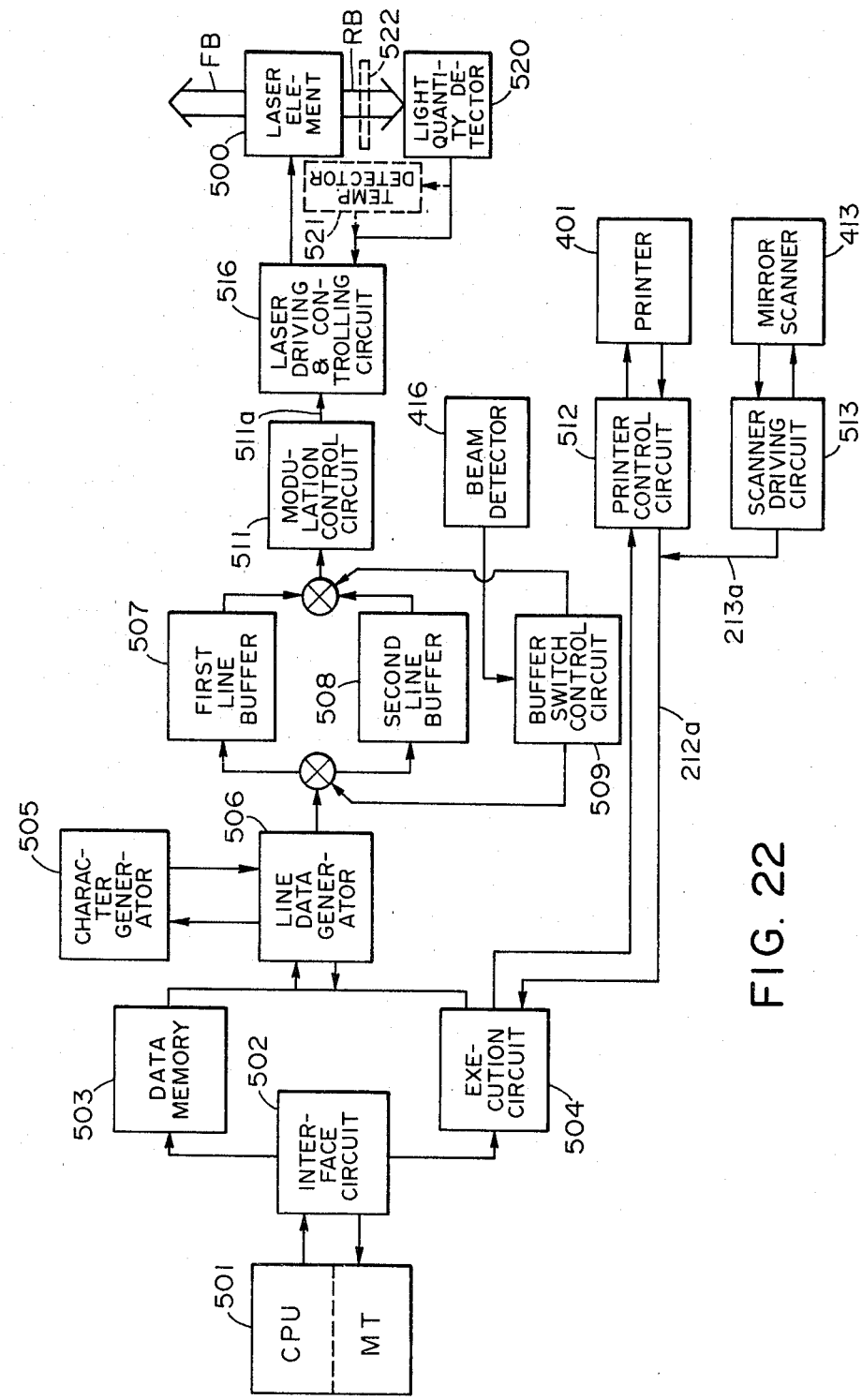
FIG. 22 is a control block diagram of the FIG. 21 apparatus.

Reference is now had to FIG. 22 to describe the operation of receiving figure or character information from a computer and producing a desired hard copy by the apparatus of the present embodiment. The information from a computer 501 is applied to the interface circuit 502 of the present apparatus in a predetermined format directly or through a recording medium such as a magnetic tape or a magnetic disc. The various instructions from the computer are decoded and executed by an instruction execution circuit 504. Data is stored in a data memory 503 by a predetermined amount. In the case of character information, the data is in the form of binary code and in the case of figure information, the data is in the form of data of a unit of the image forming the figure or in the form of data of lines forming the figure (so-called vector data). These modes are designated prior to the data, and the instruction execution circuit 504 controls the data memory 503 and line data generator 506 so as to process the data in accordance with the designated mode. The line data generator 506 generates a final data corresponding to one scan line.

That is, when data is given in the form of character code, character patterns are read out from a character generator 505 and character patterns corresponding to one line are juxtaposed and buffered or character codes corresponding to one line are buffered and character patterns are successively read out from the character generator 505 to thereby prepare the final data for modulating the laser light corresponding to one scan line. Again in the case where the data is figure information, the data is converted into scan line data to successively produce the final data for modulating the laser light corresponding to one scan line. The data corresponding to one scan line is alternately applied to a first line buffer 507 and a second line buffer 508 under the control of a buffer switch control circuit 509, each of said line buffers comprising a shift register or the like having a number of bits equal to the number of image elements in one scan line.

Further, the data of the first line buffer 507 and the second line buffer 508 are successively read out by one bit corresponding to one scan line with the beam detection signal from the beam detector 416 (FIG. 20) as the trigger signal, and are applied to a laser modulation control circuit 511. During the time that the reflecting surface of the scanner 413 scans over the photosensitive drum along a line perpendicular to the direction of rotation thereof, the signal 511a from the laser modulation control circuit 511 is applied to the laser element 500 through a laser driving and controlling circuit 516 which controls the laser driving current, and a light-and-dark pattern of one scan line is imparted to the photosensitive drum 402. Data is alternately read out from the first and second line buffers 507 and 508 under the control of the buffer switch control circuit 509. That is, when data is being read out from one of the line buffers, data is being written into the other line buffer. By such system, all of the data can be applied to the modulator when the interval between the first scanning and the subsequent scanning is very short for the scanner 412 to sweep over the photosensitive drum 402. During the time that one scan line is scanned, the photosensitive drum 420 continues to rotate at a constant velocity and moves by a suitable scan line interval.

Upon receipt of the start instruction from the instruction execution circuit 504, a printer control circuit 512 for controlling a printer 401 causes the printer to start its operation, and printer ready signal 512a and scanning ready signal 413a which is derived from a scanner driving circuit 513 for controlling the scanner 413 are returned to the instruction execution circuit 504. When signal is applied to the laser element 500 and the first data of one page is written into the photosensitive drum 402, plain recording paper 406a is fed by the paper feeding mechanism 406 at such a timing that said written data is transferred to the head portion of the page at the image transfer station. Thus, the character or figure information from the computer 501 is put out as a clear hard copy on the plain paper.

The rear beam RB from the laser element 500 is applied from the previously described light quantity detector 520 to the laser driving and controlling circuit 516, whereby the so-called APC is effected. In the case of the semiconductor laser device according to the embodiment of FIGS. 12 and 13, a temperature detector 521 such as a thermistor is provided and, in the case of the semiconductor laser device according to the embodiments of FIGS. 15-20, an optical filter 522 conforming to the aforementioned spectrum sensitivity characteristic of the photosensitive medium is provided between the laser element 500 and the light quantity detector 520.

According to the present invention, as has been described above, it has become possible to provide a semiconductor laser device in which the rear beam does not mix with the front beam and moreover highly accurate beam output control is possible, and it has also become possible to provide a semiconductor laser device which can compensate for the variation in sensitivity of the photosensitive medium resulting from the shift of wavelength based on temperature variation, as well as an image recording apparatus using such semiconductor laser device. Moreover, they can be realized at low cost and with a simple construction and thus, the present invention is really useful.

The present invention is not restricted to the above-described embodiments, but various modifications may be made therein without departing from the scope of the invention as defined in the appended claims.

What we claim is:

1. A semiconductor laser device having a stabilized output beam, comprising:
   a semiconductor laser element for emitting a front beam and a rear beam in a direction different from that of said front beam; and
   a light-receiving element for directly detecting the intensity of the rear beam from said laser element, said light-receiving element being disposed in opposition to the surface of said semiconductor laser element from which the rear beam is emitted and being inclined relative to the rear beam so as to be non-perpendicular thereto and so as not to mix the rear beam reflected from the light-receiving surface of said light-receiving element with the front beam.

2. A semiconductor laser device according to claim 1, wherein said light-receiving element is installed with the light-receiving portion thereof for receiving the peak beam more remote from the beam emitting surface of said laser element than are other light-receiving portions of said light-receiving element.

3. A semiconductor laser device according to claim 1, further comprising control means for controlling the intensity of the output beam of said laser element on the basis of the detection output of said light-receiving element.

4. A semiconductor laser device according to claim 1, wherein a plurality of light-receiving elements are provided and each of them is disposed symmetrically with respect to the perpendicular to said beam emitting surface.

5. A semiconductor laser device having a stabilized output beam, comprising:

a semiconductor laser element;

driving means for driving said semiconductor laser element;

a light-receiving element for detecting the intensity of the output beam of said laser element;

a temperature detecting element for detecting temperature provided near said laser element; and control means for controlling said driving means in accordance with the output of said temperature detecting element and the output of said light-receiving element and for thereby controlling the light quantity of the output beam of said laser element to vary in accordance with wavelength shift of the output beam caused by temperature variation.

6. A semiconductor laser device according to claim 5, wherein said light-receiving element detects the beam intensity of the rear output beam of said laser element.

7. A semiconductor laser device according to claim 5, further comprising a carrier carrying said laser element thereon and wherein said temperature detecting element is provided on said carrier.

8. A semiconductor laser device according to claim 7, wherein said temperature detecting element is attached to said carrier by a heat-conductive substance.

9. A semiconductor laser device according to claim 5, wherein said temperature detecting element is a thermistor whose resistance value is variable by temperature variation.

10. A semiconductor laser device according to claim 9, wherein a fixed resistor is connected in series with said thermistor and arbitrary B constant of the thermistor is obtained by selecting the resistance value of said fixed resistor.

11. A semiconductor laser device according to claim 10, wherein the detection output voltage of said light-receiving element is applied across said connected fixed resistor and said thermistor.

12. An image recording apparatus comprising:

a semiconductor laser element;

a photosensitive medium receiving the output light of said laser element;

means for forming an electrostatic latent image on said photosensitive medium in response to said output light; and compensation means for compensating for a variation in sensitivity of said photosensitive medium caused by an output wavelength shift based on a temperature variation of said laser element.

13. An image recording apparatus according to claim 12, wherein said compensation means comprises a light-receiving element for measuring the intensity of the output beam of said laser element, and an optical filter provided in front of said light-receiving element.

14. An image recording apparatus according to claim 13, wherein said optical filter is an optical filter having a transmission factor distribution corresponding to the spectrum sensitivity distribution of said photosensitive medium.

15. An image recording apparatus according to claim 14, wherein said optical filter comprises a dielectric multi-layer film formed on a substrate.

16. An image recording apparatus according to claim 15, wherein said dielectric multi-layer film comprises zirconium dioxide and magnesium fluoride alternately layered.

17. An image recording apparatus according to claim 12, wherein said compensation means comprising a temperature detecting element and a control circuit for controlling a current flowing to said laser element by temperature variation.

18. An image recording apparatus according to claim 17, further comprising measuring means for measuring the intensity of the light from said laser element and wherein said control circuit controls the current flowing to said laser element by the outputs of both said measuring means and said temperature detecting element.

19. An image recording apparatus according to claim 13 or 14, wherein said light-receiving element measures the intensity of the rear beam from said laser element, and the front beam from said laser element is projected upon said photosensitive medium.

20. An image recording apparatus according to claim 19, wherein said light-receiving element is disposed in inclined relationship with the beam emitting surface of said laser element.

21. An image recording apparatus comprising:

a photosensitive medium;

charging means for uniformly charging said photosensitive medium;

a semiconductor laser element;

modulating means for giving strength and weakness to the output beam of said semiconductor laser element;

deflector means for deflecting said output beam to form a latent image on said photosensitive medium by discharging said photosensitive medium by the modulated beam modulated by said modulating means;

first detector means for detecting the intensity of said output beam;

means for controlling the driving current of said laser element in accordance with the detection output of said first detector means; and compensation means for compensating for a variation in sensitivity of said photosensitive medium caused by the shift of the output wavelength of said laser element resulting from a temperature variation, said compensation means comprising second detector means for detecting the temperature of said semiconductor laser element and means for varying the driving current of said laser element in accordance with the output of said second detector means.

22. An image recording apparatus according to claim 21, further comprising developing means for developing said latent image into a visible image.

23. An image recording apparatus according to claim 21, wherein said photosensitive medium is formed of CdS.

24. An image recording apparatus according to claim 23, wherein said photosensitive medium is one sensitized by mixing impurities with CdS.

25. An image recording apparatus according to claim 21, wherein said photosensitive medium is a three-layer photosensitive medium comprising, from the surface thereof, an insulating layer, a photoconductive layer and an electrically conductive layer.

26. An image recording apparatus according to claim 25, wherein said photoconductive layer is formed of CdS and impurities.

27. An image recording apparatus according to claim 21, wherein the output wavelength of said laser beam is in the near-infrared range.

28. An image recording apparatus comprising:

a semiconductor laser element;

a photosensitive medium receiving the output light of said laser element;

means for forming an electrostatic latent image on said photosensitive medium in response to said output light;

detector means for detecting the intensity of said output light;

an optical filter for compensating for a variation in sensitivity of said photosensitive medium caused by an output wavelength shift based on a temperature variation of said laser element, said optical filter having a transmission factor distribution corresponding to the spectrum sensitivity distribution of said photosensitive medium; and an adjusting mechanism capable of arbitrarily adjusting an angle of said optical filter with respect to the direction of emergence of said output light from said laser element.

29. An image recording apparatus according to claim 28, wherein said optical filter is mounted between said detector means and said laser element.

30. An image recording apparatus comprising:

a photosensitive medium;

charging means for uniformly charging said photosensitive medium;

a semiconductor laser element;

modulating means for giving strength and weakness to the output beam of said semiconductor laser element;

deflector means for deflecting said modulated output beam to form a latent image on said photosensitive medium by discharging said photosensitive medium in accordance with the modulated beam modulated by said modulating means;

detector means for detecting the intensity of said output beam;

means for controlling the driving current of said laser element in accordance with the detection output of said detector means; and compensation means for compensating for a variation in sensitivity of said photosensitive medium caused by the shift of the output wavelength of said laser element resulting from a temperature variation, said compensation means comprising an optical filter having a transmission factor distribution corresponding to the spectrum sensitivity distribution of said photosensitive medium.

31. An image recording apparatus according to claim 30, wherein said optical filter is mounted between said detector means and said laser element.

32. An image recording apparatus according to claim 31, wherein the transmission factor distribution of said optical filter in a region of the near-infrared range conforms relatively to the sensitivity distribution of said photosensitive medium in the region.

* * * * *